United States Patent
Colarossi et al.

(10) Patent No.: US 11,479,198 B2
(45) Date of Patent: Oct. 25, 2022

(54) ACTIVE POWER BLOCKING CIRCUIT FOR RESTRAINT CONTROL MODULE

(71) Applicant: VEONEER US, INC., Southfield, MI (US)

(72) Inventors: Vincent Colarossi, Dearborn Heights, MI (US); David Eiswerth, Wixom, MI (US)

(73) Assignee: VEONEER US, LLC, Southfield, MI (US)

(*) Notice: Subject to any disclaimer, the term of this patent is extended or adjusted under 35 U.S.C. 154(b) by 938 days.

(21) Appl. No.: 16/171,294

(22) Filed: Oct. 25, 2018

(65) Prior Publication Data

US 2020/0130624 A1    Apr. 30, 2020

(51) Int. Cl.
*B60R 21/017*    (2006.01)
*G01R 31/00*    (2006.01)
*H03K 17/60*    (2006.01)
*B60R 21/01*    (2006.01)

(52) U.S. Cl.
CPC ........ *B60R 21/0173* (2013.01); *G01R 31/006* (2013.01); *H03K 17/60* (2013.01); *B60R 2021/01184* (2013.01)

(58) Field of Classification Search
CPC ...... B60R 2021/01184; B60R 21/0173; G01R 31/2829; G01R 31/2827; G01R 31/006; H03K 17/60
See application file for complete search history.

(56) References Cited

U.S. PATENT DOCUMENTS

| | | | | |
|---|---|---|---|---|
| 5,432,385 A * | 7/1995 | Kincaid | ................ | B60R 21/017 280/735 |
| 5,612,623 A * | 3/1997 | Watanabe | ........... | B60R 21/0173 280/735 |
| 6,166,451 A * | 12/2000 | Pigott | ................... | B60R 21/017 307/10.1 |
| 2008/0086250 A1* | 4/2008 | Kuivenhoven | ..... | B60R 21/0173 701/45 |
| 2008/0143180 A1* | 6/2008 | Ito | ......................... | H02H 9/046 307/10.1 |

* cited by examiner

*Primary Examiner* — Son T Le
*Assistant Examiner* — Adam S Clarke
(74) *Attorney, Agent, or Firm* — Dickinson Wright PLLC

(57) ABSTRACT

A duplex squib module is provided. The duplex squib module may include a first squib, a second squib, a first active blocking circuit, and a second active blocking circuit: The first active blocking circuit being in series with the first squib. The first active blocking circuit having a transistor in series with a first diode to block current in a first direction. The second active blocking circuit being in series with the second squib. The second active blocking circuit having a transistor in series with a first diode to block current in a second direction opposite of the first direction.

13 Claims, 2 Drawing Sheets

ACTIVE POWER BLOCKING CIRCUIT FOR RESTRAINT CONTROL MODULE

FIELD OF THE DISCLOSURE

The present disclosure relates generally to circuits used to selectively initiate deployment of automotive safety devices such as airbag inflators based on direction of current flow through a safety system circuit.

BACKGROUND

Safety standards for modern automotive vehicles are becoming increasingly strict. The result of heightened standards and innovations by designers of vehicle resistant systems is twofold: 1) occupants of vehicles are safer and less likely to suffer serious injury in a collision, and 2) manufacturers are held to higher standards with little opportunity to offset costs. As a result of these trends, innovations that increase safety while retaining efficiency and low production costs are essential to manufacturers of related technology.

Duplex Firing involves the use of a single wire pair to connect two squibs to the Restraints ECU, eliminating two wires and associated connectors in the vehicle. In this Duplex Firing concept, two wires and associated connectors in the vehicle can be eliminated to support every two squibs. A restriction in this duplex concept is that the squibs connected in Duplex Firing configuration cannot be deployed simultaneously. However, controlling and diagnosing duplex restraint modules present certain challenges.

BRIEF SUMMARY

Airbag systems include a restraint control module and a reaction canister. The reaction canister contains a folded airbag and an inflator with an igniter (squib). The inflator is connected to the restraint control module via conductive wires and associated connectors. The total electrical path of these wires and connectors to and from the inflator is termed the "squib loop." Airbag deployment is initiated when vehicle acceleration sensors measure a threshold sufficient to warrant deployment. Upon this event, a signal is sent to the restraint control module. The restraint control module then provides sufficient energy to the inflator through the squib loop to initiate the discharge of inflator gas to inflate and deploy the airbag.

The restraint control module controls the overall operation of the airbag system and essentially could be viewed as the main control unit for the airbag system. As with any system based on electronic components and sensors, airbag systems and their associated electronic components, require power from a power supply in order to function properly. Specifically, in airbag safety systems, customer demand and safety standards require that the integrity of operation be ensured through diagnostic verification of the airbag ignition system. A common method for diagnostic testing is completed by testing the squib loop for proper electrical resistance throughout vehicle operation.

Historically, airbag safety restraint systems typically employed a single inflator device to release inflation gas for inflating a vehicle occupant restraint airbag in the event of a collision. For these systems, the squib loop resistance is typically composed of linear resistive components including wire, connectors, clock-springs, EMI inductors, and the squib. Due to the constant resistance of these components they can be simplified by combining the individual element resistances into a total equivalent resistance. Since all of the components of a single inflator squib loop include only linear resistance components, the typical method employed for measuring squib loop resistance involves measurement of the differential squib loop voltage while providing specific bias current(s) and determining the squib loop resistance as a function of the voltage differential and the bias current. Such measurement is done at a current level significantly below the threshold to cause ignition of the squib. While this and other similar methods are effective for squib loops with only linear resistance, this analysis may be inadequate to accurately determine the performance of more advanced systems.

In response to increasingly complex performance specifications, inflatable safety restraint technology has led to the development of what has been termed "adaptive" or "smart" inflator devices and corresponding inflatable restraint systems. Some examples of the present state of the art "smart" systems employ two stages (dual stage systems) for inflators that typically utilize two separate initiator assemblies. Common implementations of these systems utilize separate dedicated wires (firing lines) to conduct each safety device function signal. The signals are sent from a restraint control module to each airbag initiator being commanded to activate. Thus, the evolution of the technology to "smart" systems has led to an increase in the number of individual squib loops, connectors, output pins, and restraint control module connectors required for providing airbag activation. As a result, such dual stage systems are typically larger in packaging, size, heavier, and more complex in operation than their single stage counterparts.

In an effort to minimize the complexity in wiring and reduce wiring and connection cost, the dual stage systems have combined multiple squib loops into a single wiring squib loop path, with preferably only two electrical conductors. This design approach is lighter and more efficient in design, but has also introduced some non-linear electrical components in the squib loop to provide for isolation of the individual squibs. In the single wiring squib loop design, the wire, connectors, clock-springs, EMI inductors, and squib are all comprised of resistively linear electrical components. Additional, non-linear components, added to isolate individual squibs, can be diodes (standard p-n junction diodes, Schottky diodes, etc.) bipolar junction transistors (BJT), insulated gate bipolar transistors (IGBT), MOSFETs, or other non-linear components. Unlike the common single stage designs, the linear and non-linear components cannot be combined into a simple, linear equivalent resistance. Other forms of advanced resistant systems implement multiple activated systems. For example, in addition to an airbag initiator squib, another system feature may be an airbag tether release, airbag vent, pretensioner or other system having a separate squib. Accordingly, dual stage resistant systems are an example of a duplex restraint system, on providing multiple commands which may be controlled on a single pair of conductors as described above.

The added complexity of duplex systems has rendered prior practices for squib loop resistance measurement insufficient. As stated previously, diagnostic testing is completed by testing the squib loop for proper resistance, but in non-linear systems, the resistance changes at varying bias currents. The result of the addition of non-linear components is a diminished the capability to complete accurate diagnostic testing and a limited capacity to provide the safety feedback sought after by vehicle manufacturers.

The present disclosure provides a system and method which addresses shortcomings of current solutions for conducting periodic diagnostic testing of squib loop resistances in multi-stage inflators and other duplex systems for motor vehicle occupant restraint systems. Current solutions are limited to trading efficient wiring methods for diminished diagnostic capability. The method and system disclosed allow for initiation of two safety devices (squibs) the combination of which is connected by two conductors to two input/outputs of the ECU. Thus reducing the number of conductors necessary between ECU and safety device. The two squibs may be selectively initiated based on the direction of current flow in the two conductors connecting the safety device to the ECU. This system also allows for improved diagnostic testing of the linear resistance components of airbag initiator devices that incorporate non-linear resistive electrical components in their circuitry. The benefits of the disclosed implementation include decreased material and cost while maintaining reliable and accurate diagnostic measurement of linear squib loop resistance.

The previously known circuits to provide the duplex firing concept utilize discrete component like diodes or zeners etc to provide the duplex firing concept. The diodes and zeners have a forward conduction characteristics which are highly variable and dependent on temperature, device processing etc for diagnostic and deployment conditions. In reverse conduction mode, the diodes block current to very low, acceptable levels.

The new active power circuit is a combination of components that provides closed loop active control of the forward voltage while maintaining an ultra-low output impedance characteristic during diagnostic and deployment conditions in the forward conducting path. In the reverse path, the new active power circuit blocks current to low, acceptable levels. The new active power circuit forward conduction characteristics are not similar to those of the previously known circuits for duplex firing.

DETAILED DESCRIPTION OF THE DRAWINGS AND THE PRESENTLY PREFERRED EMBODIMENTS

The Active Power Blocking Circuit was established to facilitate the duplex firing concept. Certain aspects of the disclosed design provides a discrete solution to support duplex firing capability, deployment and safety diagnostics capability, and a precisely regulated voltage function for the power blocking concept. The design may also conduct deployment current to igniter in forward conduction mode and block the current to the igniter in reverse conduction mode. The design allows diagnosis of the igniter loop and the duplex circuit function for deployment capability.

Figure 1:
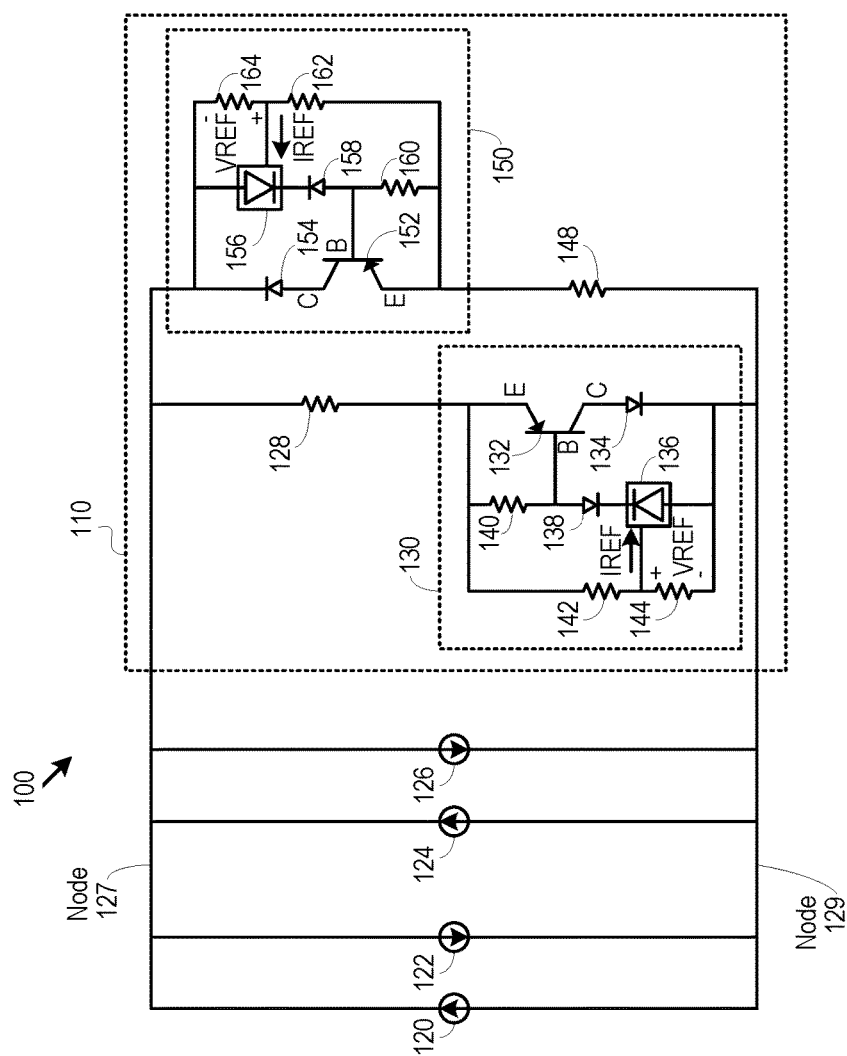
FIG. 1 is a schematic view of a system utilizing a duplex restraint module.

FIG. 1 is a schematic view of a system 100 utilizing a duplex restraint module. Current source 120 may be paired with current source 122. Current source 120 may be oriented in the opposite polarity of current source 122. Current source 120 may be used for diagnostics of the first active power blocking circuit 130. Current source 122 may be used for diagnostics of active power blocking circuit 150. The feed side of current source 120 and the return side of current source 122 may be connected to node 127. The return side of current source 120 and the source side of current source 122 may be connected to node 129.

Current source 124 may be paired with current source 126. Current source 124 may be oriented in the opposite polarity of current source 126. Current source 124 may be used for deployment of the first active power blocking circuit 130. Current source 126 may be used for deployment of active power blocking circuit 150. The feed side of current source 124 and the return side of current source 126 may be connected to node 127. The return side of current source 124 and the source side of current source 126 may be connected to node 129.

The current sources 120, 122, 124, and 126 may be connected through wires (e.g. cables) to a duplex squib module 110. Squib 128 may have a first side connected to node 127 and a second side connected to active power blocking circuit 130. The active power blocking circuit 130 may include a transistor 132. For example, transistor 132 may be a bipolar transistor, such as a PNP transistor. The second side of squib 128 may be connected to a emitter of transistor 132. The emitter of transistor 132 may also be connected to a first side of resistor 140 and a first side of resistor 142. The collector of transistor 132 may be connected to an anode of diode 134. The cathode of diode 134 may be connected to node 129.

The second side of resistor 140 may be connected to a base of transistor 132. The base of transistor 132 may also be connected to the anode of diode 138. The cathode of diode 138 may be connected to an output of voltage regulator at 136. The return of voltage regulator 136 may be connected to node 129.

The second side of resistor 142 may be connected to the input of voltage regulator 136. The input of voltage regulator 136 may also be connected to the first side of resistor 144. The second side of resistor 144 may be connected to node 129. As such, resistor 142 and resistor 144 may form a voltage divider to set the input voltage for the voltage regulator 136.

Squib 148 may have a first side connected to node 129 and a second side connected to active power blocking circuit 150. The active power blocking circuit 150 may include a transistor 152. For example, transistor 152 may be a bipolar transistor, such as a PNP transistor. The second side of squib 148 may be connected to an emitter of transistor 152. The emitter of transistor 152 may also be connected to a first side of resistor 160 and a first side of resistor 162. The collector of transistor 152 may be connected to an anode of diode 154. The cathode of diode 154 may be connected to node 127.

The second side of resistor 160 may be connected to a base of transistor 152. The base of transistor 152 may also be connected to the anode of diode 158. The cathode of diode 158 may be connected to an output of voltage regulator at 156. The return of voltage regulator 156 may be connected to node 127.

The second side of resistor 162 may be connected to the input of voltage regulator 156. The input of voltage regulator 156 may also be connected to the first side of resistor 164. The second side of resistor 164 may be connected to node 127. As such, resistor 162 and resistor 164 may form a voltage divider to set the input voltage for the voltage regulator 156.

In this implementation active power circuits 130 and 150 are oriented having an opposing polarity for permitting duplex operation of squibs 128 and 148. In the forward current direction, the active power circuit 130 and 150 will try to regulate the voltage from the emitter of the transistor (132, 152) to the cathode of the diode (134, 154) (to a voltage level determined by R2,R3, V_REF_Internal,I_REF as follows VREG=R[((R2+R3)/R3)*V_REF_Internal]+ I_REF*R2. Where R1 is the resistance of resistors 140,160; R2 is the resistance of resistors 142, 162; and R3 is the resistance of resistors 144, 164. V_REF_Internal is the voltage applied to the reference terminal of the shunt regulator (136, 156) typically 2.5V and I_REF is current provided to the reference terminal of the shunt regulator (136, 156) typically 2 uA. The VREG voltage is targeted to be as low as possible yet maintain enough voltage across the transistor (132, 152) to maintain an acceptable level of forward current gain (Beta_Q1). The active power circuits 130 and 150 may power up and draw its required current directly from the input pins. The ultra-low output resistance is provided by the closed loop performance of the voltage regulation loop. The output resistance of the active power circuits 130 and 150 open loop may be divided by the quantity {Open loop gain*(R3/(R2+R3))} to achieve ultra low output resistance over the full diagnostic and deployment current levels. In the respective reverse current direction, the active power circuits 130 and 150 will try and block current flow due to reverse biasing of the diodes (138, 158,134,154). A very small level of reverse current is provided as follows:

$$I\_Reverse=(V\_Reverse-V\_Anode\text{-}to\text{-}REF)/R2.$$

Where V_Reverse is the voltage between node 127 and 129 (can be as high as 35V) and V_Anode-to-REF is the voltage across the shunt regulator (136, 156) (typically 0.65V). The current is controlled by R2 and can be managed to be small and insignificant to diagnostic or deployment functions.

During diagnostic operation, and before making the squib loop resistance measurement, a qualification measurement may be made to make sure that the system is not faulted. During this qualification measurement, the voltage drop across the active power circuits 130 and 150 plus the voltage drop across the total squib loop resistance at each of two different current levels may be required only for the purpose to qualify that the system is normal and not faulted. Once this qualification is successful, then the actual squib resistance measurement process can be made. During the squib resistance measurement process, the voltage drop of the respective active power circuit plus the total squib loop resistance may be made at each of two different current levels. The change in voltage across the active power circuit at each of these two difference current levels is insignificant due to the ultra-low output resistance of the active power circuit.

Figure 2:
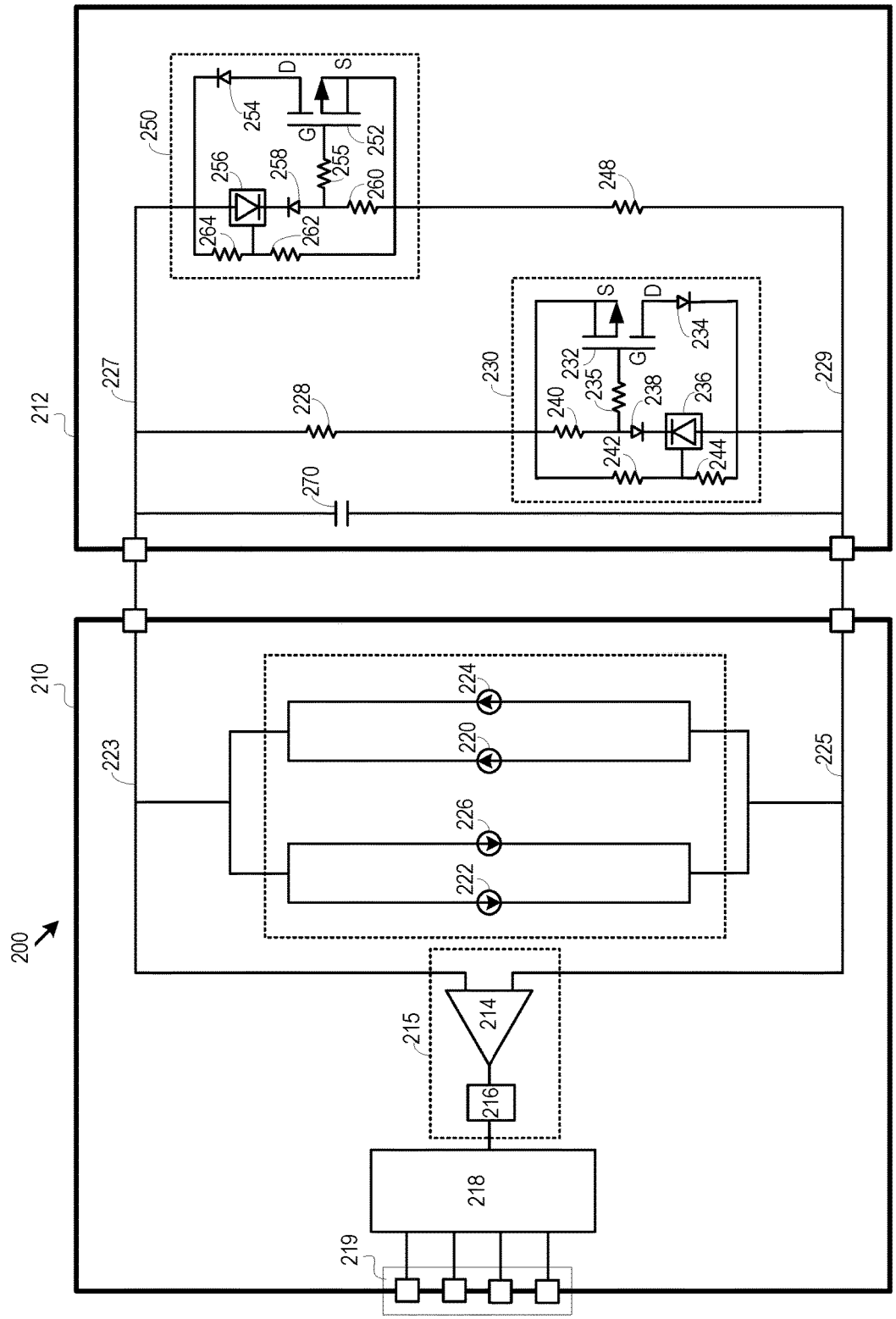
FIG. 2 is a schematic view of another system utilizing a duplex restraint module.

FIG. 2 is a schematic view of another system 200 utilizing a duplex restraint control module 210 and a duplex squib module 212. The duplex restraint control module 210 may include multiple current sources. Current source 222 and current source 226 may be oriented in the same direction. As such, the source side of current source 222 and current source 226 may be connected to node 225. The return side of current source 222 and current source 226 may be connected to node 223. Current source 222 may be used for activating diagnostics of active power blocking circuit 230. Current source 226 may be used for deployment of active power blocking circuit 230.

Current source 220 and current source 224 may be oriented in the same direction. As such, the source side of current source 220 and current source 224 may be connected to node 223. The return side of current source 220 and current source 224 may be connected to node 225. Current source 220 may be used for activating diagnostics of active power blocking circuit 250. Current source 224 may be used for deployment of active power blocking circuit 250.

Node 225 may be connected for example through a cable and interconnections to node 229 in the duplex squib module 212. Node 223 may be connected for example through a cable and interconnects to node 227 in the duplex squib module 212.

Squib 228 may have a first side connected to node 227. The second side of squib 228 may be connected to active power blocking circuit 230. The second side of squib 228 may be connected to the source of the p-channel mosfet transistor 232. The drain of transistor 232 may be connected to the anode of diode 234. The cathode of diode 234 may be connected to node 229. The source of transistor 232 may be connected to the first side of resistor 240. The second side of resistor 240 may be connected to the anode of diode 238. Also, the gate of transistor 232 may be connected to the anode of diode 238 through resistor 235. The cathode of diode 238 may be connected to an output of voltage regulator 236. The return of voltage regulator 236 may be connected to node 229. The source of transistor 232 may also be connected to a first side of resistor 242. The second side of resistor 242 may be connected to an input of voltage regulator 236. The input of voltage regulator 236 may also be connected to a first side of resistor 244.

The second side resistor 244 may be connected to node 229. As such, resistor 242 and resistor 244 may form a voltage divider to set the voltage at the input of voltage regulator 236.

Squib 248 may have a first side connected to node 229. The second side of squib 248 may be connected to active power blocking circuit 250. The second side of squib 248 may be connected to the source of the p-channel MOSFET transistor 252. The drain of transistor 252 may be connected to the anode of diode 254. The cathode of diode 254 may be connected to node 227. The source of transistor 252 may be connected to the first side of resistor 260. The second side of resistor 260 may be connected to the anode of diode 258. Also, the gate of transistor 252 may be connected to the anode of diode 258 through resistor 255. The cathode of diode 258 may be connected to an output of voltage regulator 256. The return of voltage regulator 256 may be connected to node 227. The source of transistor 252 may also be connected to a first side of resistor 262. The second side of resistor 262 may be connected to an input of voltage regulator 256. The input of voltage regulator 256 may also be connected to a first side of resistor 264.

The second side resistor 264 may be connected to node 227. As such, resistor 262 and resistor 264 may form a voltage divider to set the voltage at the input of voltage regulator 256.

The capacitor 270 may be connected between node 227 and node 229. The capacitor 270 may remove noise from the diagnostic signals for testing active power blocking circuit 230 and active power blocking circuit 250.

Measurement circuit 215 may include amplifier 214 in voltage measurement block 216. The first input of amplifier 214 may be connected to node 223 and a second input of amplifier 214 may be connected to node 225. The output of measurement block 216 may be provided to controller 218. Controller 218 may communicate with other system processors through communication interface 219.

In this implementation active power circuits 230 and 250 are oriented having an opposing polarity for permitting duplex operation of squibs 228 and 248. In the forward current direction, the active power circuit 230 and 250 will try to regulate the voltage from the source of the transistor (232, 252) to the cathode of the diode (234, 254). In the respective reverse current direction, the active power circuits 230 and 250 will try and block current flow due to reverse biasing of the diodes (238, 258,234,254).

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

As a person skilled in the art will readily appreciate, the above description is meant as an illustration of the principles of this disclosure. This description is not intended to limit the scope or application of this disclosure in that the systems and methods are susceptible to modification, variation and change, without departing from spirit of this disclosure, as defined in the following claims.

The invention claimed is:

1. A duplex squib module comprising:
a first squib;
a first active blocking circuit in series with the first squib, with the series combination of the first active blocking circuit and the first squib connected between a first node and a second node, the first active blocking circuit having a first transistor including a first conducting lead and a second conducting lead and configured to selectively conduct current therebetween, the conducting leads of the first transistor connected in series with a first diode to block current between the first node and the second node in a first direction;
a second squib; and
a second active blocking circuit in series with the second squib, with the series combination of the first active blocking circuit and the first squib connected between the first node and the second node, the second active blocking circuit having a second transistor in series with a second diode to block current between the first node and the second node in a second direction opposite of the first direction.

2. The duplex squib module according to claim 1, wherein the first conducting lead of the first transistor is connected to the first squib and the second conducting lead of the first transistor is connected to the first diode.

3. The duplex squib module according to claim 1, wherein the first transistor further includes a control lead configured to control a current between the first conducting lead and the second conducting lead, and wherein the control lead is connected to the first conducting lead through a first resistor.

4. The duplex squib module according to claim 3, wherein the first diode includes a cathode,
wherein the first active blocking circuit further includes a third diode and a voltage regulator defining an output terminal and a return terminal, and
wherein the control lead of the first transistor is connected to the cathode of the first diode of through the third diode and the voltage regulator.

5. The duplex squib module according to claim 4, wherein the third diode and the voltage regulator are connected in series between the control lead of the first transistor and the cathode of the first diode.

6. The duplex squib module according to claim 5, wherein the third diode defines an anode and a cathode, and wherein the control lead of the first transistor is connected to the anode of the third diode and the cathode of the third diode is connected to the output terminal of the voltage regulator.

7. The duplex squib module according to claim 6, wherein the voltage regulator further includes a reference input for controlling a voltage on the output terminal, and wherein the reference input of the voltage regulator is connected to the first conducting lead of the first transistor through a second resistor and the reference input of the voltage regulator is connected to the cathode of the first diode through a third resistor.

8. The duplex squib module according to claim 1, wherein the second transistor includes a first conducting lead and a second conducting lead and is configured to selectively conduct current therebetween, and wherein the first conducting lead of the second transistor is connected to the second squib and the second conducting lead of the second transistor is connected to the second diode.

9. The duplex squib module according to claim 1, wherein the second transistor further includes a control lead configured to control a current between the first conducting lead and the second conducting lead, and wherein the control lead is connected to the first conducting lead through a fourth resistor.

10. The duplex squib module according to claim 9, wherein the second diode includes a cathode,
wherein the second active blocking circuit further includes a fourth diode and a voltage regulator defining an output terminal and a return terminal, and wherein the control lead of the second transistor is connected to the cathode of the second diode through the fourth diode and the voltage regulator.

11. The duplex squib module according to claim 10, wherein the fourth diode and the voltage regulator are connected in series between the control lead of the second transistor and the cathode of the second diode.

12. The duplex squib module according to claim 10, wherein the fourth diode defines an anode and a cathode, and wherein the control lead of the second transistor is connected to an anode of the fourth diode and the cathode of the fourth diode is connected to the output terminal of the voltage regulator.

13. The duplex squib module according to claim 12, wherein the voltage regulator further includes a reference input for controlling a voltage on the output terminal, and wherein the reference input of the voltage regulator is connected to the first conducting lead of the second transistor through a fifth resistor and the reference input of the voltage regulator is connected to the cathode of the second diode through a sixth resistor.

* * * * *